(12) United States Patent
Choi et al.

(10) Patent No.: US 12,111,567 B2
(45) Date of Patent: Oct. 8, 2024

(54) METHOD FOR PERFORMING OPTICAL PROXIMITY CORRECTION AND METHOD OF MANUFACTURING A MASK USING OPTICAL PROXIMITY CORRECTION

(71) Applicant: Samsung Electronics Co., Ltd., Suwon-si (KR)

(72) Inventors: Na-rak Choi, Yongin-si (KR); Moon-gyu Jeong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1071 days.

(21) Appl. No.: 16/389,536

(22) Filed: Apr. 19, 2019

(65) Prior Publication Data

US 2020/0081336 A1    Mar. 12, 2020

(30) Foreign Application Priority Data

Sep. 6, 2018    (KR) .................. 10-2018-0106508

(51) Int. Cl.
   *G03F 1/36*    (2012.01)
   *G06F 30/20*    (2020.01)
(52) U.S. Cl.
   CPC ............. *G03F 1/36* (2013.01); *G06F 30/20* (2020.01)
(58) Field of Classification Search
   CPC ................................. G03F 1/36; G06F 30/20
   See application file for complete search history.

(56) References Cited

U.S. PATENT DOCUMENTS

| | | | |
|---|---|---|---|
| 6,567,972 B1 * | 5/2003 | Tanaka | G03F 7/70441 716/53 |
| 6,978,438 B1 | 12/2005 | Capodieci | |
| 7,053,984 B2 | 5/2006 | Nelson et al. | |
| 7,707,538 B2 | 4/2010 | Wong et al. | |

(Continued)

FOREIGN PATENT DOCUMENTS

| | | |
|---|---|---|
| CN | 102221776 A | 3/2013 |
| CN | 108121150 A | 6/2018 |

(Continued)

OTHER PUBLICATIONS

Lam, et al. "Accurate 3DEMF mask model for full-chip simulation," Proc. SPIE 8683, Optical Microlithography XXVI, 86831D (Apr. 12, 2013); doi: 10.1117/12.2013167.

(Continued)

*Primary Examiner* — Peter L Vajda
*Assistant Examiner* — Jayson D Cosgrove
(74) *Attorney, Agent, or Firm* — Muir Patent Law, PLLC

(57) ABSTRACT

Provided are a method for performing optical proximity correction (OPC) of improving an accuracy of a mask image by reflecting efficiently a mask topography effect or a coupling effect between edges of a pattern, and a method of manufacturing a mask by using OPC. The method for performing OPC includes: extracting edges for a layout of a pattern on a mask; extracting edge pairs in which widths between adjacent edges among the edges are equal to or less than a certain distance; generating a coupling edge for each of the edge pairs; generating a first mask image by applying an edge filter to the edges; and correcting the first mask image by applying a coupling filter to the coupling edge.

8 Claims, 17 Drawing Sheets

(56) References Cited

U.S. PATENT DOCUMENTS

| | | |
|---|---|---|
| 8,438,505 B2 | 5/2013 | Tsai et al. |
| 8,490,030 B1 | 7/2013 | Chiang et al. |
| 9,348,964 B2 | 5/2016 | Zhang et al. |
| 10,036,961 B2 | 7/2018 | Jang et al. |
| 2002/0138810 A1 | 9/2002 | Lavin et al. |
| 2003/0218776 A1* | 11/2003 | Morimoto ................. G06T 7/12 382/199 |
| 2008/0003510 A1* | 1/2008 | Harazaki ................... G03F 1/36 430/5 |
| 2009/0170010 A1 | 7/2009 | Belleson et al. |
| 2010/0151690 A1 | 6/2010 | Britcher et al. |
| 2015/0302132 A1* | 10/2015 | Zhang ....................... G03F 1/36 716/53 |
| 2017/0082927 A1* | 3/2017 | Hsu ........................... G03F 1/36 |
| 2017/0285490 A1 | 10/2017 | Lam |
| 2018/0341173 A1* | 11/2018 | Li ............................. G03F 1/36 |

FOREIGN PATENT DOCUMENTS

| | | |
|---|---|---|
| KR | 1020090069095 A | 6/2009 |
| KR | 1020090109349 A | 10/2009 |
| KR | 10-2016-0131110 A | 11/2016 |
| KR | 1020170051005 A | 5/2017 |
| TW | 201820265 A | 6/2018 |
| TW | 201823852 A | 7/2018 |

OTHER PUBLICATIONS

Taiwanese Office Action issued Aug. 2, 2022 for corresponding TW Patent Application No. 108117288.
Taiwanese Search Report dated Aug. 1, 2022 for corresponding TW Patent Application No. 108117288.
Notice of Allowance dated Jun. 20, 2024 for corresponding KR Patent Application No. 10-2018-0106508.

* cited by examiner

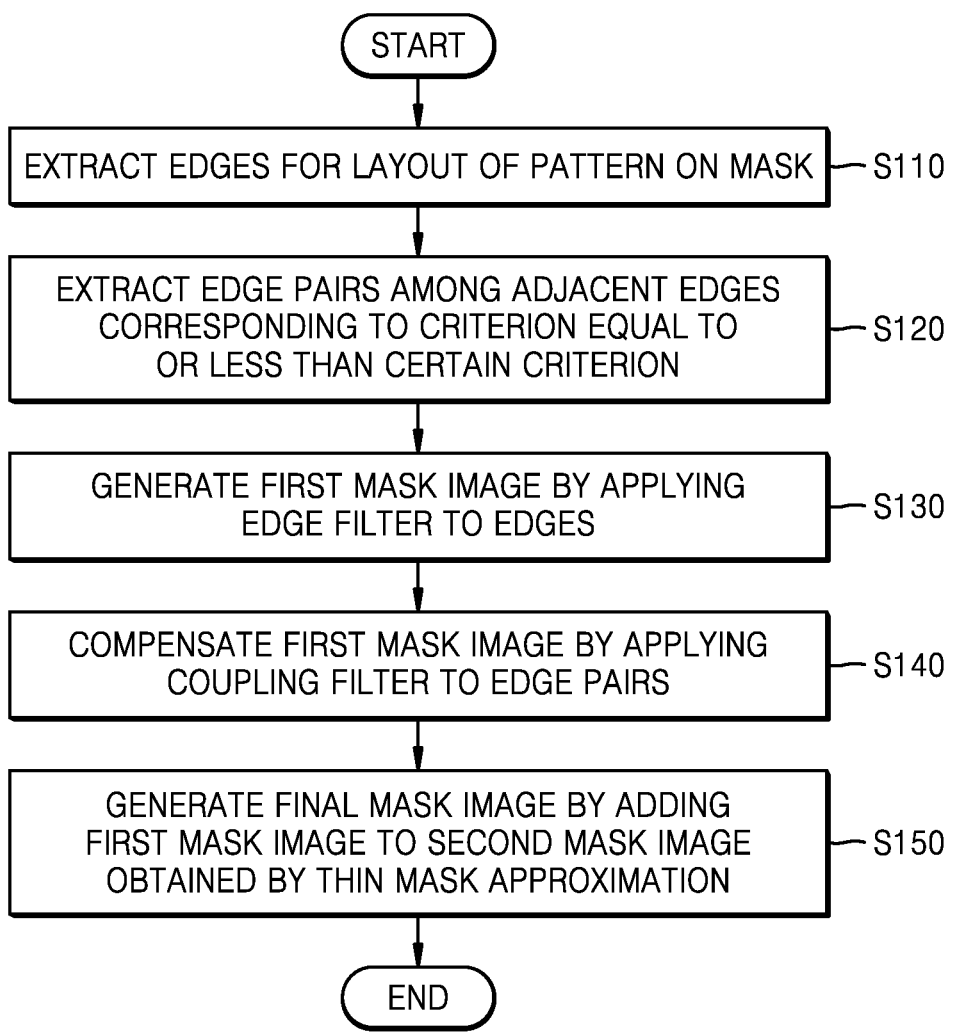

METHOD FOR PERFORMING OPTICAL PROXIMITY CORRECTION AND METHOD OF MANUFACTURING A MASK USING OPTICAL PROXIMITY CORRECTION

CROSS-REFERENCE TO RELATED APPLICATION

This application claims the benefit of Korean Patent Application No. 10-2018-0106508, filed on Sep. 6, 2018, in the Korean Intellectual Property Office, the disclosure of which is incorporated herein in its entirety by reference.

BACKGROUND

The inventive concept relates to a method of manufacturing a mask, and more particularly, a method for performing optical proximity correction (OPC) and a method of manufacturing a mask by using OPC.

In a semiconductor process, a photolithography process using a mask may be performed to form a pattern on a semiconductor substrate such as a wafer. The mask may be simply defined as a pattern transfer body in which a pattern shape of an opaque material is formed on a transparent base material. A manufacturing process of the mask is briefly described. First, a required circuit may be designed and a layout for the required circuit may be designed. Then, mask design data obtained through OPC may be transferred as mask tape-out (MTO) design data. Thereafter, mask data preparation (MDP) may be performed based on the MTO design data, and a front end of line (FEOL) such as an exposure process and a back end of line (BEOL) such as defect inspection may be performed to manufacture the mask.

SUMMARY

The inventive concept provides a method for performing optical proximity correction (OPC) capable of improving mask image accuracy by efficiently reflecting a mask topography effect or a coupling effect between edges of a pattern, and a method of manufacturing a mask by using OPC.

According to an aspect of the inventive concept, provided is a method for performing optical proximity correction (OPC) including: extracting edges for a layout of a pattern on a mask; extracting edge pairs in which widths between adjacent edges among the edges are equal to or less than a certain distance; generating a coupling edge for each of the edge pairs; generating a first mask image by applying an edge filter to the edges; and correcting the first mask image by applying a coupling filter to the coupling edge.

According to another aspect of the inventive concept, provided is a method for performing optical proximity correction (OPC) including: extracting edges for a layout of a pattern on a mask; extracting edge pairs in which an edge among the edges includes a value equal to or less than a certain criterion; generating a first mask image by applying an edge filter to the edges; and correcting the first mask image by applying a coupling filter to the edge pairs; and generating a final mask image by adding a second mask image obtained by a thin mask approximation to the first mask image.

According to another aspect of the inventive concept, provided is a method of manufacturing a mask, the method including: extracting edges for a layout of a pattern on a mask; extracting edge pairs in which widths between adjacent edges among the edges are equal to or less than a certain distance; generating a coupling edge for each of the edge pairs; generating a first mask image by applying an edge filter to the edges; correcting the first mask image by applying a coupling filter to the coupling edge, and generating a final mask image; performing a simulation by reflecting data of the final mask image to an optical proximity correction (OPC) model; transferring design data obtained through the simulation as mask tape-out (MTO) design data; preparing mask data based on the MTO design data; and performing an exposure onto a mask substrate based on the mask data.

BRIEF DESCRIPTION OF THE DRAWINGS

Embodiments of the inventive concept will be more clearly understood from the following detailed description taken in conjunction with the accompanying drawings in which:

FIG. 1 is a flowchart of a process of a method for performing optical proximity correction (OPC) according to an embodiment;

DETAILED DESCRIPTION OF THE EMBODIMENTS

Figure 2A:
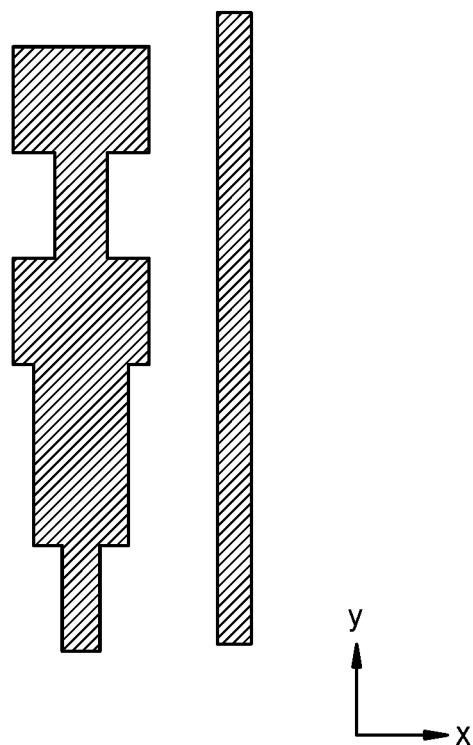
FIGS. 2A through 2C are conceptual diagrams for explaining an operation of extracting edges of a layout and an operation of generating a first mask image in the method for performing OPC of FIG. 1.

Hereinafter, embodiments of the present inventive concept will be described in detail with reference to the accompanying drawings. Identical reference numerals are used for the same constituent elements in the drawings, and a duplicate description thereof are omitted.

FIG. 1 is a flowchart of a process of a method for performing optical proximity correction (OPC) according to an embodiment.

Referring to FIG. 1, the method for performing OPC according to embodiments of the inventive concept may first extract edges of a layout of a pattern on a mask (S110). Here, the pattern on the mask may denote a pattern that may be transferred onto a substrate such as a wafer through an exposure process and form a target pattern on the substrate. In general, a shape of the target pattern on the substrate may be different from that of the pattern on the mask due to characteristics of the exposure process. In addition, since the pattern on the mask is reduced, projected, and transferred onto the substrate, the pattern on the mask may have a larger size than the target pattern on the substrate.

The layout of the pattern on the mask may have a one-dimensional or two-dimensional shape. Here, the one-dimensional shape may denote not a line having no area but a shape extending in one direction such as a line and space pattern. The edges may correspond to straight lines surrounding a perimeter of the layout of the pattern. According to an embodiment, the edges may correspond to straight lines surrounding a space between the layouts of the pattern, or straight lines surrounding the layouts of the pattern and a space between the layouts of the pattern. A more detailed description on the extraction of the edges is given with reference to FIG. 2B.

Next, edge pairs corresponding to a criterion equal to or less than a certain criterion may be extracted among adjacent edges (S120). One criterion for extracting edge pairs may be a certain distance between the adjacent edges. For example, when the edges surround the layout of the pattern, the edge pairs may be extracted depending on whether a distance between the adjacent edges corresponding to a width of the pattern is less than the certain distance, and when the edges surround the space, the edge pairs may be extracted depending on whether the distance between the adjacent edges corresponding to an interval of the spaces is equal to or less than a certain distance. As a criterion for extracting the edge pairs, the certain distance set between the adjacent edges may be, for example, several nm to several tens of nm. However, the criterion for extracting the edge pairs is not limited thereto.

Another criterion for extracting the edge pairs may be a coupling effect set between the adjacent edges. For example, depending on whether the coupling effect occurring between the adjacent edges exceeds a certain coupling effect, the edge pairs may be extracted. However, since the coupling effect increases as the distance between the adjacent edges decreases, there may be little difference between a reference for extracting the edge pairs based on the distance between the adjacent edges and a reference for extracting the edge pairs based on the coupling effect between the adjacent edges.

The coupling effect between the adjacent edges may be explained by maximum error absolute (MEA) described later with reference to FIG. 4. The MEA and its coupling effect are described in more detail with reference to FIG. 4.

A first mask image may be generated by applying an edge filter to the extracted edges (S130). Here, the first mask image may be a portion of the near field image of the mask calculated on a back surface of the mask immediately after light passes through the mask and may correspond to a near field image of a portion corresponding to the extracted edges. The edge filter is a filter capable of generating the near field image of the portion corresponding to the edges and may be changed depending on the positions and characteristics of the edges. By applying the edge filter to each of the edges, the near field image corresponding to each of the edges may be generated. A concept of the edge filter is described in more detail with reference to FIGS. 3A through 3E.

On the other hand, an order of the extraction of the edge pairs (S120) and the generation the first mask image (S130) may be changed. In other words, after the first mask image is generated, the edge pairs may be extracted.

Next, the first mask image may be corrected by applying the coupling filter to the edge pairs (S140). The first mask image obtained through the edge filter in a portion of the edges where the distance between the adjacent edges is short or the coupling effect between the adjacent edges is large, in other words, in a portion where the edge pair is located may be different from the actual near field image near the edges. Accordingly, the first mask image may be corrected by combining the near field image for compensation that is generated by applying the coupling filter to the portion where the edge pair is located, with the first mask image that has been obtained through the edge filter. An application method, a generation principle, etc. of the coupling filter are described in more detail with reference to FIGS. 6A through 7D.

Next, a final mask image may be generated by combining a second mask image obtained by a thin mask approximation with the corrected first mask image (S150). The thin mask approximation may be referred to as a Kirchhoff approximation. It is assumed that light completely passes through the mask in an open portion and that light is completely blocked in an blocked portion where the mask is very thin to an extent that the thickness of the mask is almost null, and thus, the thin mask approximation may denote the calculated near field image. The thin mask approximation is explained in more detail in the description given with reference to FIG. 3B.

By combining the second mask image with the first mask image that is corrected as described above, the final mask image corresponding to the layout of the pattern on the mask may be generated. In addition, the final mask image may, by including the first mask image previously corrected by the coupling filter, correspond to a mask near field image that more accurately represents the layout of the pattern on the mask.

For reference, a pattern on a mask may generally have a thickness that is not negligible compared to an exposure wavelength. Accordingly, to perform a precise OPC, it may be required to calculate an optical mask image considering the effect of mask topography, that is, the near field image of the mask. On the other hand, to perform the OPC on a large area mask, calculation of the optical mask image may need to be performed in a short time, and accordingly, a rigorous simulation method requiring a long calculation time may not be used for the calculation of the optical mask image. Here, the rigorous simulation method may indicate an electromagnetic field simulation method such as a rigorous coupled-wave analysis (RCWA) or a finite difference time domain (FDTD) simulation method. In the case of a rigorous simulation method, the mask near field image reflecting accurately the shape of the pattern on the mask may be obtained, but a calculation time may be too long. For calculation of the fast mask near field image, the edge filter to be described later with reference to FIGS. 3A through 3E may be generally used. However, even in the case of using the edge filter, since the coupling effect increases as the distance between the edges decreases due to a small size of the pattern, an error may increase in the mask near field image generated by using the edge filter.

However, in the method for performing OPC according to embodiments of the inventive concept, an error in the first mask image obtained by using only the edge filter may be significantly reduced by correcting the first mask image obtained by using the edge filter by additionally applying the coupling filter to edge pairs having a large coupling effect due to a short distance between the edges. In addition, the method for performing OPC according to embodiments of the inventive concept may calculate quickly and accurately the mask image without changing a simulation in a calculation method of an existing mask image, by using the edge filter and the coupling filter.

After the final mask image is generated, a general process for performing the method for performing OPC may be performed. The method may be generally briefly explained as the following.

As the pattern becomes finer, an optical proximity effect (OPE) due to an influence between adjacent patterns may be generated during the exposure process. The method for performing OPC may denote a method of suppressing an occurrence of the OPE by correcting the layout of the pattern. The method for performing OPC may be classified into two types: a rule-based method for performing OPC and a simulation-based or model-based method for performing OPC. The method according to embodiments of the inventive concept may be, for example, a model-based method for performing OPC. The model-based method for performing OPC may be good in terms of time and cost because measurement results of only representative patterns are used without needing to measure all of a large number of test patterns.

The method for performing OPC according to embodiments of the inventive concept may include a method of adding not only a modification of the layout of the pattern but also sub-lithographic features called serifs at corners of the pattern, as well as a method of adding sub-resolution assist features (SRAFs) such as scattering bars. Here, the serifs may be rectangular features that are generally located at each corner of the pattern and used to sharpen the corners of the pattern or to correct for a distortion factor caused by intersection of the patterns. The SRAF may be an auxiliary feature used to solve a deviation of the OPC caused by a density difference of the pattern and may be a feature that is formed in a size smaller than the resolution of an exposure apparatus and is not transferred onto a resist layer.

In performing OPC according to embodiments of the inventive concept, first, basic data for the OPC may be prepared. Here, the basic data may include data of the shape of the patterns of a sample, locations of the patterns, a type of measurement such as a measurement of a space or a line of the pattern, a basic measurement value, etc. In addition, the basic data may include information about the thickness, refractive index, dielectric constant, etc. of a photoresist (PR) and may include a source map for a type of an illumination system. However, the basic data is not limited to the above-exemplified data.

After the basic data is prepared, an optical OPC model may be generated. The generation of the optical OPC model may include optimization of a defocus start (DS) position, a best focus (BF) position, etc. in the exposure process. In addition, the generation of the optical OPC model may include generation of the mask image considering a diffraction phenomenon of light, an optical state of the exposure apparatus itself, etc. The final mask image previously obtained by using the edge filter and the coupling filter may be used to generate the optical OPC model. However, the generation of the optical OPC model is not limited thereto. For example, the generation of the optical OPC model may include various contents related to the optical phenomenon in the exposure process.

After the optical OPC model is generated, an OPC model for the PR may be generated. The generation of the OPC model for the PR may include optimization of a threshold value of the PR. Here, the threshold value of PR may denote a threshold value at which a chemical change occurs in the exposure process and may be provided as, for example, the intensity of exposure light. The generation of the OPC model for the PR may also include selecting an appropriate model form from various PR model forms.

Both the optical OPC model and the OPC model for the PR may be collectively referred to as an OPC model. Thus, both a process of generating the optical OPC model and a process of generating the OPC model for the PR may be collectively referred to as a process of generating the OPC model, in other words, an OPC modeling process. Hereinafter, unless otherwise particularly noted, the OPC model is used as a concept for a combination of the optical OPC model and the OPC model for the PR.

After the OPC model is generated, the OPC model may be verified. The verification of the OPC model may be performed by a root mean square (RMS) calculation for critical dimension (CD) error, an edge placement error (EPE) check, etc. When the OPC model is included in a certain specification, the verification of the OPC model may be completed, and the corresponding OPC model may be selected as the OPC model for the simulation. When the OPC model is not included in the certain specification, the process of generating the OPC model, that is, the process of generating the optical OPC model and/or the process of generating the OPC model for the PR may be performed again.

After the OPC model is verified, the simulation may be performed by using the corresponding OPC model. Through the simulation using the OPC model, the design data of the mask close to an actual measurement may be obtained. The design data of the mask obtained through the simulation may be transferred later to a mask production team as MTO design data for manufacturing the mask.

Figure 2B:
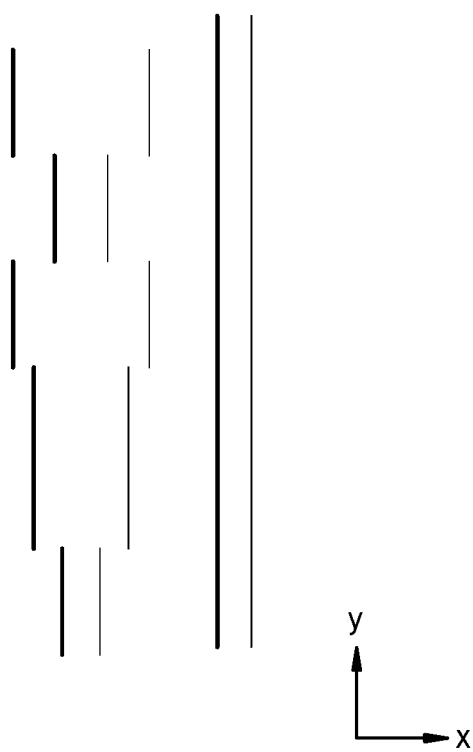
Figure 2C:
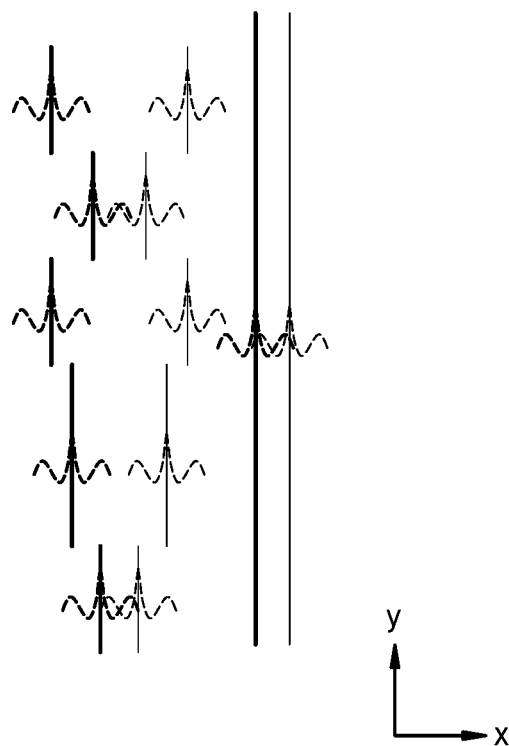

FIGS. 2A through 2C are conceptual diagrams for explaining an operation of extracting edges of a layout (S110) and an operation of generating a first mask image (S130) in the method for performing OPC of FIG. 1.

Referring to FIGS. 2A and 2B, FIG. 2A illustrates a layout of a pattern on a mask, and FIG. 2B illustrates edges in a vertical direction, that is, in a second direction (y direction) extracted from the edges surrounding the layout of the pattern in FIG. 2A. Even though the edges surround the same pattern, calculation results of the near field image at left edges and right edges may be different. The reason why may be attributed to a fact that light is incident with an inclination to the pattern in a normal exposure process. Accordingly, in FIG. 2B, the left edges and the right edges surrounding the same pattern are illustrated as having different thicknesses, respectively.

Referring to FIG. 2C, after the edges for the layout of the pattern are extracted, the first mask image may be generated by applying the edge filter to the edges. Shapes of the edge filters applied to the edges may be different from each other. In particular, as mentioned above, the shapes of the edge filters applied to the left edges may be different from those applied to the right edges due to the inclined incidence of light. Accordingly, in FIG. 2C, to emphasize the difference in the edge filters, waveforms that simplify the edge filters applied to the left edges and waveforms that simplify the edge filters applied to the right edges are illustrated to have different thicknesses.

In FIGS. 2B and 2C, even though extraction of the edges and an application of the edge filter are described mainly with respect to the vertical direction, that is, the second direction (y direction) of the layout of the pattern, the extraction of the edges and the application of the edge filters may also be applied to a horizontal direction, that is, a first direction (x direction) of the layout of the pattern. In addition, the shapes of the edge filters applied to the edges in the first direction (x direction) may be different from those applied to the edges in the second direction (y direction).

By applying the edge filters to the edges, the near field image of the mask corresponding to the edges (hereinafter, referred to as a 'mask image') may be generated. The principle of generating the mask image according to an application of the edge filter is described below with reference to FIGS. 3A through 3E.

FIGS. 3A through 3E are conceptual diagrams for explaining the edge filter and the principle of generating the first mask image by using the edge filter, with reference to an operation of generating of the first mask image in FIG. 1 (S130).

Figure 3A:
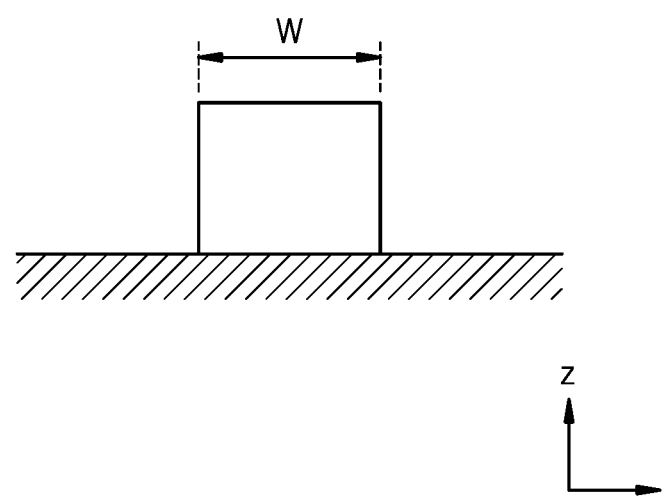
FIGS. 3A through 3E are conceptual diagrams for explaining an edge filter and the principle of generating the first mask image by using the edge filter, with reference to an operation of generating of the first mask image in FIG. 1.

First, FIG. 3A illustrates a shape of a pattern formed on a wafer by using a mask. For convenience of explanation, FIG. 3A illustrates a vertical cross-section of a line pattern of a one-dimensional shape. The line pattern may have a certain width W in the first direction (x direction) as illustrated in FIG. 3A.

Figure 3B:
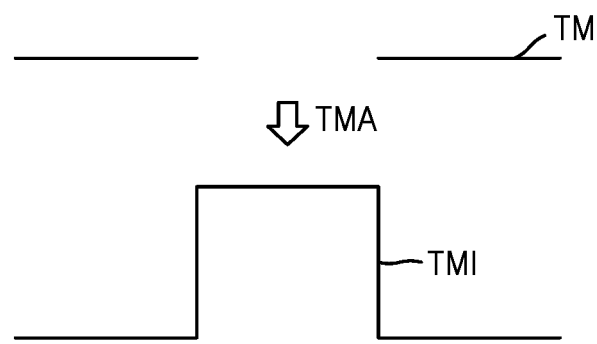

Referring to FIG. 3B, to form the pattern illustrated in FIG. 3A, a mask image is illustrated for the case when an ideal thin mask TM is used. In other words, FIG. 3B illustrates a mask image, obtained by a thin mask approximation TMA (hereinafter, referred to as a 'thin mask image' TMI). Here, the ideal thin mask TM may be a mask having little thickness, and an open portion thereof may completely pass light and a blocked portion thereof may completely block light. As illustrated, the thin mask image TMI may have a shape that is substantially similar to a shape of a pattern to be formed on a wafer.

Figure 3C:
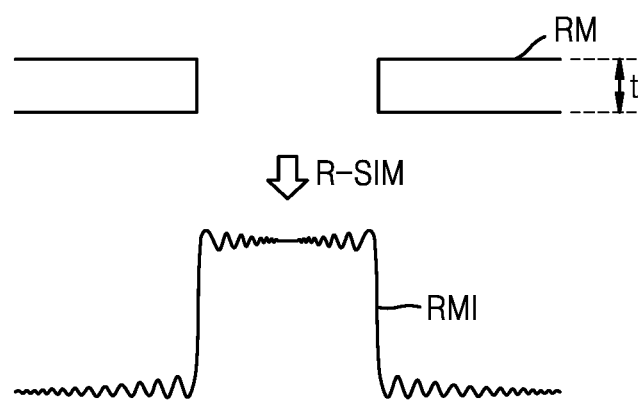

Referring to FIG. 3C, a real mask RM used for forming a pattern is illustrated. The real mask RM may have a certain thickness t, and thus, a mask image obtained through the real mask RM may be different from the thin mask image TMI. A mask image, calculated through a rigorous simulation (R-SIM) such as a rigorous coupled wave analysis (RCWA) simulation or a FDTD simulation, (hereinafter, referred to as a 'rigorous mask image' RMI) is illustrated under the real mask RM.

Figure 3D:
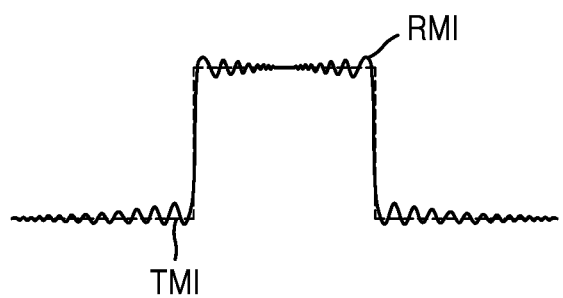

Referring to FIG. 3D, the rigorous mask image RMI is illustrated as a solid line, and the thin mask image TMI is illustrated as a dashed line. As illustrated in FIG. 3D, the rigorous mask image RMI may be different from the thin mask image TMI, and in particular, it may be identified that the rigorous mask image RMI is significantly different from the thin mask image TMI at portions corresponding to the edges of the pattern. In other words, it may be understood that as a position gets farther away from portions corresponding to the edges of the pattern, the rigorous mask image RMI and the thin mask image TMI become substantially the same.

Figure 3E:
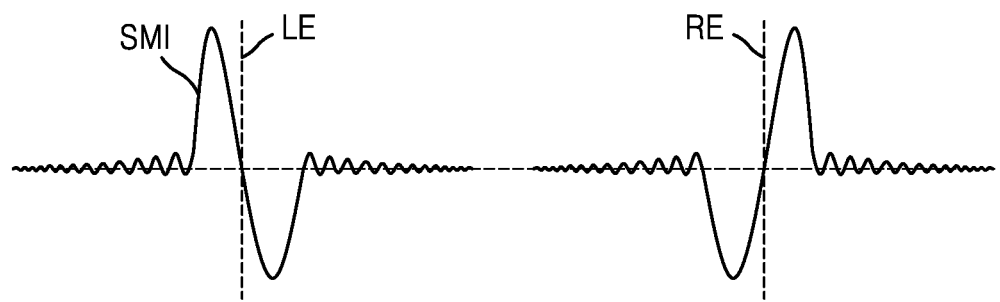

Referring to FIG. 3E, a shape of a subtracted mask image SMI obtained by subtracting the thin mask image TMI from the rigorous mask image RMI is illustrated. As described above, a change in magnitude of the amplitude of the subtracted mask image SMI at portions adjacent to a left edge LE and a right edge RE may increase, and a change in the magnitude of the amplitude at portions farther away from the left edge LE and the right edge RE may decrease. Here, the magnitude of the amplitude may indicate an absolute value of the amplitude, which is applied to the following descriptions. For reference, in FIG. 3E, the subtracted mask image SMI may illustrate a more enlarged scale of the amplitude compared to the rigorous mask image RMI and the thin mask image TMI.

On the other hand, in FIG. 3E, even though the subtracted mask image SMI of the left edge LE portion and the subtracted mask image SMI of the right edge RE portion are illustrated in the same form, due to the inclined incidence of light, the subtracted mask image SMI of the left edge LE portion and the subtracted mask image SMI of the right edge RE portion may appear in different forms.

The subtracted mask images SMIs of the left and right edge portions may correspond to the edge filters. Thus, the edges may be extracted from the layout of the pattern, and by applying the edge filters corresponding to the edges, the subtracted mask image SMI, that is, the first mask image may be generated. Subsequently, by adding the thin mask image TMI to the first mask image, a mask image similar to the rigorous mask image RMI may be generated.

In general, when a coupling effect between adjacent edges is negligibly small due to a large width of a pattern, a mask image may be generated quickly and relatively accurately through a method of applying an edge filter. However, when the coupling effect between the adjacent edges increases due to a small width of a pattern, an error in the mask image obtained through the method of applying the edge filter may increase.

Figure 4:
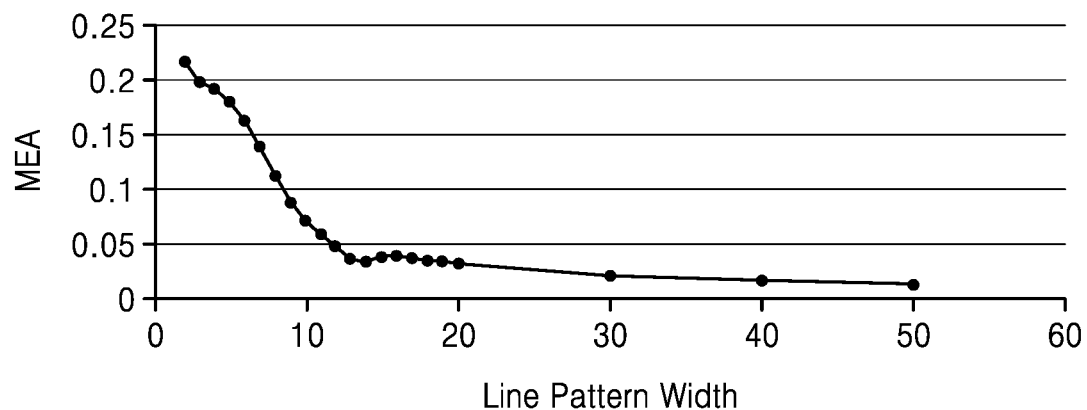
FIG. 4 is a graph illustrating a level of an error of the first mask image generated by using the edge filter according to a width of a pattern to explain the coupling effect between the edges of the pattern.

FIG. 4 is a graph illustrating a level of an error of the first mask image generated by using the edge filter according to a width of a pattern to explain the coupling effect between the edges of the pattern. Here, the horizontal axis may denote a line pattern width in nm units and the vertical axis may denote the MEA. The MEA is an abbreviation for maximum error absolute, which denotes an absolute value of the maximum value among the difference values between the rigorous mask image RMI and the mask image that is calculated by using the edge filter, that is, the first mask image.

Referring to FIG. 4, when the width of the line pattern is approximately equal to or greater than about 15 nm, the MEA may be equal to or less than about 0.05. Accordingly, it may be understood that the first mask image calculated by using the edge filter is substantially the same as the rigorous mask image RMI. It may be understood that, when the width of the line pattern is equal to or greater than about 15 nm, the coupling effect between the edges is insignificant, and accordingly, it may be understood that there is not a big problem even though the mask image is calculated by the method using the edge filter.

However, when the width of the line pattern is reduced to be equal to or less than about 15 nm, the MEA may increase sharply beyond about 0.05, and the error in the first mask image calculated by using the edge filter may rapidly increase. When the width of the line pattern is reduced to be equal to or less than 15 nm, the coupling effect between the edges may increase, and accordingly, it may be understood that the mask image may not be calculated accurately by the method using the edge filter.

On the other hand, when the criterion for extracting the edge pairs is defined as the certain distance between the adjacent edges, the criterion may be, for example, about 15 nm. In others, when the distance between the two adjacent edges is equal to or less than about 15 nm, the two adjacent edges may be extracted as the edge pair. On the other hand, when the criterion for extracting the edge pairs is defined as the certain coupling effect between the adjacent edges, the criterion may be, for example, the MEA of about 0.05 nm. In other words, when the MEA between two adjacent edges exceeds equal to or greater than about 0.05, the mask image may be extracted as the edge pair. In the method for performing OPC according to embodiments of the inventive concept, as the criterion for extracting the edge pairs, the certain distance or the certain coupling effect is not limited to the above-described value. For example, as the criterion for extracting edge pairs, the certain distance, the certain coupling effect, etc. may be variously changed based on a shape and density of patterns on a mask.

Figure 5A:
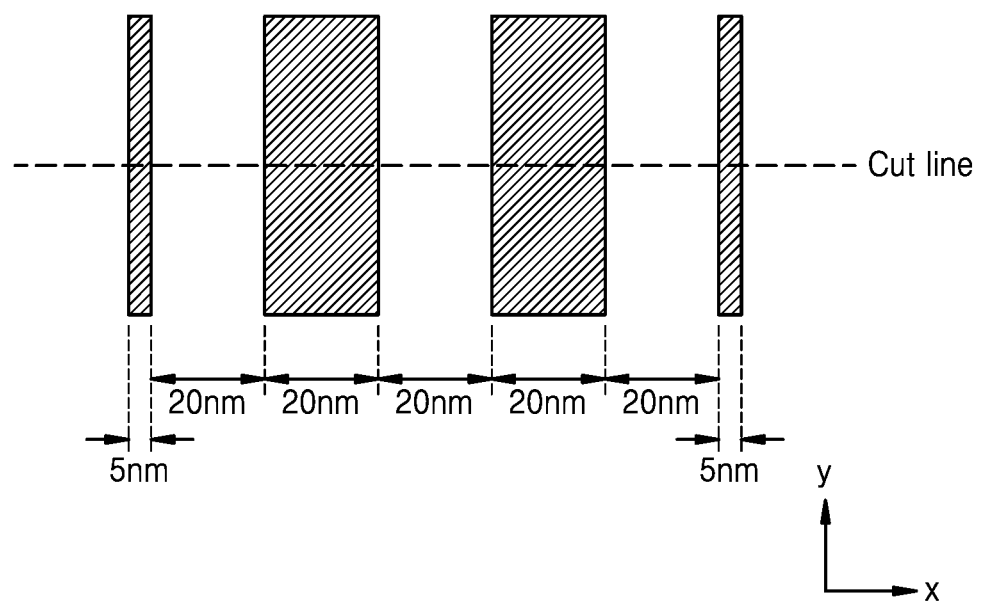
FIG. 5A is a graph of a layout of a mask pattern.
Figure 5B:
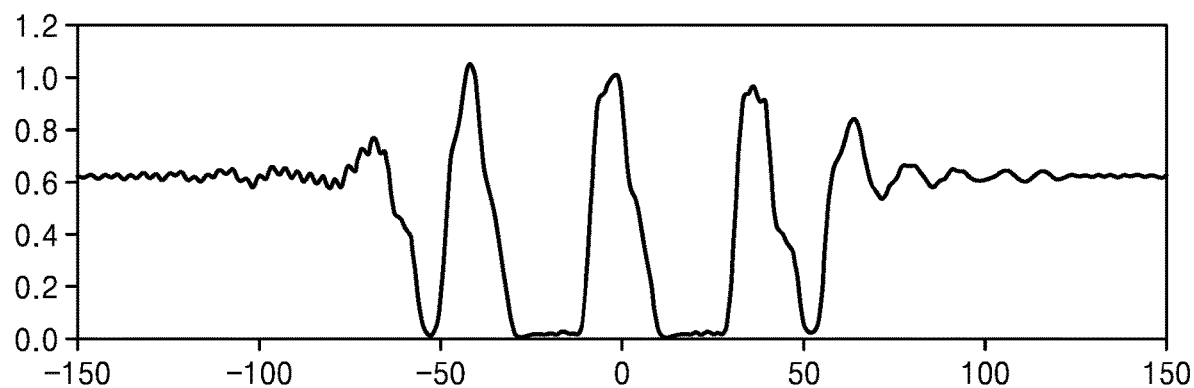
FIG. 5B is a graph of a first mask image.
Figure 5C:
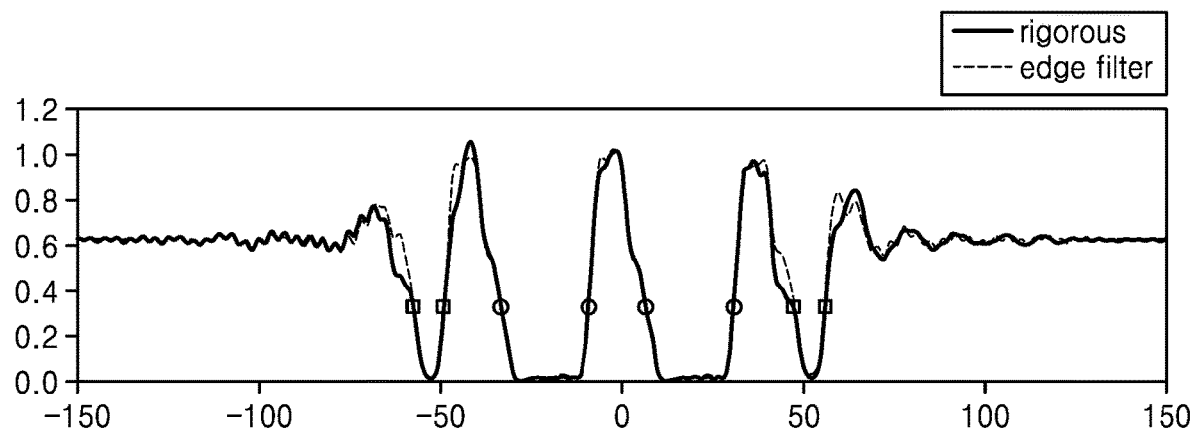
FIG. 5C is a graph illustrating differences between a rigorous mask image obtained by using a rigorous simulation and the first mask image obtained by using the edge filter.

FIG. 5A is a graph of a layout of a mask pattern, FIG. 5B is a graph of the rigorous mask image RMI, and FIG. 5C is a graph illustrating differences between the rigorous mask image RMI obtained by using the rigorous simulation and the first mask image obtained by using the edge filter. In FIGS. 5B and 5C, the horizontal axis may represent a position in the first direction (x-direction) corresponding to the layout of the pattern in FIG. 5A in nm units, and the vertical axis may represent amplitude of the near field in arbitrary unit (a.u.) units. In addition, in FIG. 5C, a solid line may represent the rigorous mask image RMI and a dashed line may represent the first mask image.

Referring to FIG. 5A, the layout of the pattern on the mask is illustrated, and the layout of the pattern may have a one-dimensional line-and-space shape. Two line patterns in the central portion each may have a width of about 20 nm in the first direction (x direction), and the two line patterns on both perimeters each may have a width of about 5 nm in the first direction (x direction). In addition, spaces between the line patterns in the first direction (x direction) may have a width of about 20 nm. A cut line extending in the first direction (x direction) at the central portion of the layout of the pattern in the second direction (y direction) may denote portions where the mask images of FIGS. 5B and 5C are calculated.

Referring to FIG. 5B, a mask image obtained by the rigorous simulation for the layout of the pattern of FIG. 5A, that is, the rigorous mask image RMI is illustrated. It may be understood from the graph in FIG. 5B that, in the layout of the pattern of FIG. 5A, the magnitude of the amplitude of the near field is small at the portion corresponding to the line pattern, and the magnitude of the amplitude of the near field is large at the portion corresponding to the space. In addition, it may be understood that the amplitude of the near field in the perimeter portion of the layout of the pattern is substantially constant.

Referring to FIG. 5C, the first mask image obtained by using the edge filter with respect to the layout of the pattern of FIG. 5A is compared to the rigorous mask image RMI in FIG. 5B. Here, the first mask image may be in a state in which the thin mask image TMI obtained by using the thin mask approximation is added thereto. It may be understood from FIG. 5C that, in both edge portions (represented as small circles) of two line patterns having the width of about 20 nm, the solid lines and the dashed lines are almost matched, and accordingly, the rigorous mask image RMI and the first mask image are almost identical.

However, in both edge portions (represented as small squares) of the two line patterns having a width of about 5 nm, there is a difference between the solid lines and the dotted lines, which indicates that there is a difference between the rigorous mask image RMI and the first mask image. As a result, in the case of two line patterns having a width of about 5 nm, it may indicate that there is an error in the first mask image calculated by using the edge filter. This may be, as described above, due to the coupling effect between the edges having narrow widths.

Figure 6A:
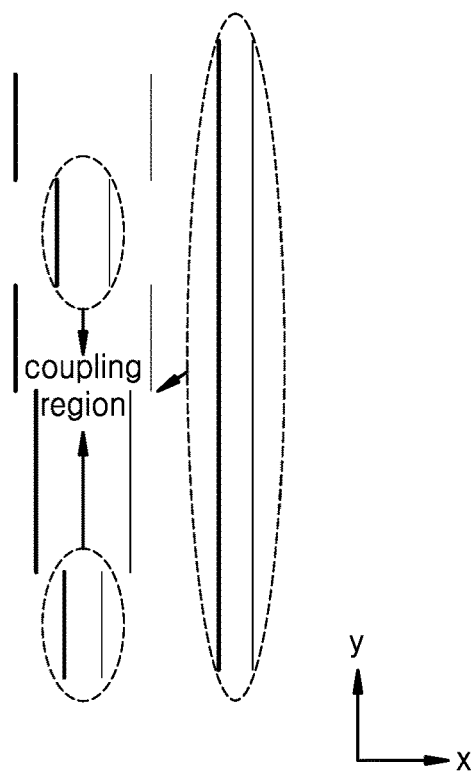
FIGS. 6A through 6C are conceptual diagrams for explaining an operation of extracting edge pairs and an operation of correcting the first mask image in the method for performing OPC of FIG. 1.
Figure 6B:
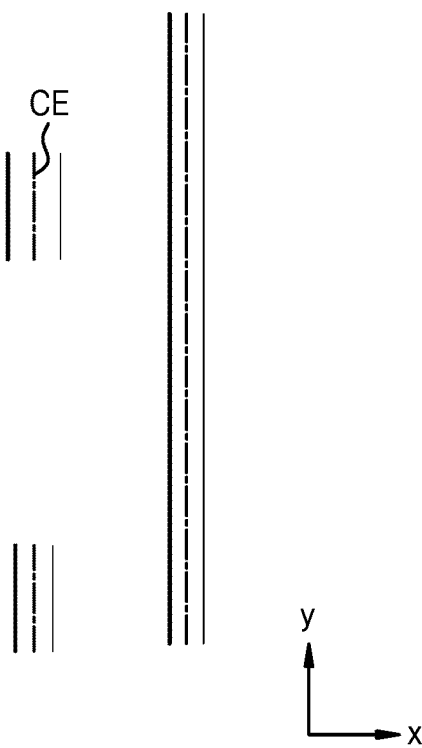
Figure 6C:
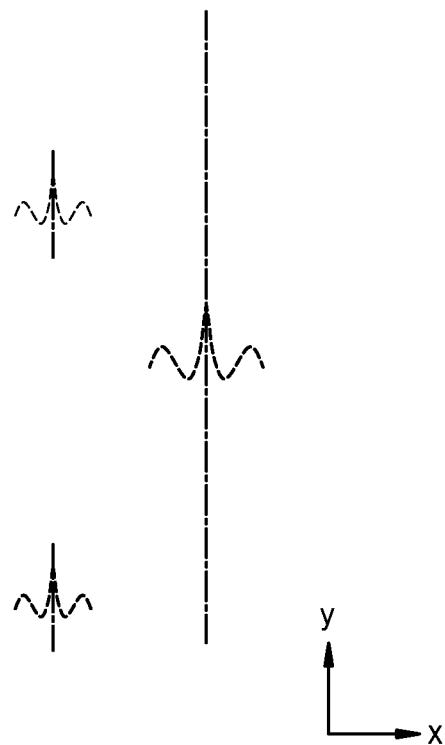

FIGS. 6A through 6C are conceptual diagrams for explaining an operation of extracting the edge pairs (S120) and an operation of correcting the first mask image (S140) in the method for performing OPC of FIG. 1. The layout of the pattern on the mask may be the same as the layout of the pattern on the mask of FIG. 2A.

Referring to FIG. 6A, edge pairs corresponding to a certain criterion may be extracted from the edges which have been extracted from the layout of the pattern in FIG. 2B. For example, when a criterion for extracting the edge pairs is the certain distance between the adjacent edges, two adjacent edges apart by equal to or less than the certain distance may be extracted as the edge pair. For example, as described with reference to FIG. 4, when the certain distance is about 15 nm, two adjacent edges having a distance therebetween that is equal to or less than 15 nm may be extracted as the edge pair. Accordingly, three edge pairs may be extracted as represented by dashed ellipses. In addition, from an aspect of the coupling effect, the portions where the extracted edge pairs are located may correspond to coupling regions where the coupling effect is significant.

On the other hand, even though it has been described that the edge pairs are extracted from the edges surrounding the layout of the pattern, the embodiment is not limited thereto, and the edge pairs may be extracted from the edges surrounding the spaces between the layouts of the pattern. For example, when the distance between the adjacent edges surrounding the pattern is greater than the certain distance but the distance between the adjacent edges surrounding the space is less than the certain distance due to narrow space widths between the patterns, the edge pair may be extracted from the edges surrounding the spaces.

Referring to FIG. 6B, after the edge pairs are extracted from the edges of the layout of the pattern, a center line of the two edges of each of the edge pairs may be generated as a coupling edge CE. In FIG. 6B, the coupling edges CE are represented as long-short dashed lines. The coupling edge CE may refer to the edge to which the coupling filter is applied.

Referring to FIG. 6C, as described above, the first mask image may be corrected by applying the coupling filter to the coupling edge CE. As described with reference to FIG. 2C, the first mask image may refer to as a first mask image obtained by applying the edge filter to all edges of the layout of the pattern. In the method for performing OPC according to embodiments of the inventive concept, the first mask image generated by the edge filter may be corrected by applying the coupling filter to one coupling edge CE that corresponds to the center line of the two edges, instead of applying the coupling filter to each of the two edges of the edge pair. This method may be caused in a process of generating the coupling filter, which is described in more detail with reference to FIGS. 7A through 7D.

On the other hand, since the shapes and widths of the edge pairs are different, the shapes of the coupling filters may be different. Thus, it is illustrated in FIG. 6C that the waveforms simplified for the coupling filters are slightly different in size and shape.

Figure 7A:
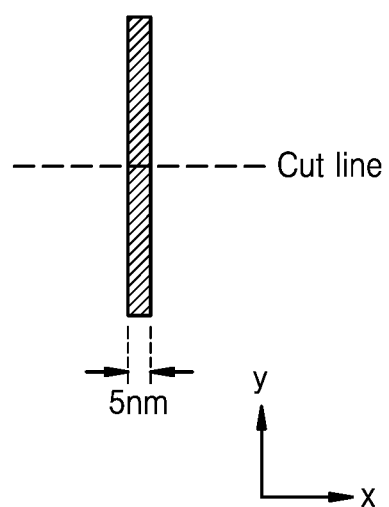
FIGS. 7A to 7D are conceptual diagrams for explaining a principle of generating the coupling filter and a principle of correcting the first mask image by using the coupling filter, in relation to the operation of correcting the first mask image in FIG. 1 (S140)
Figure 7B:
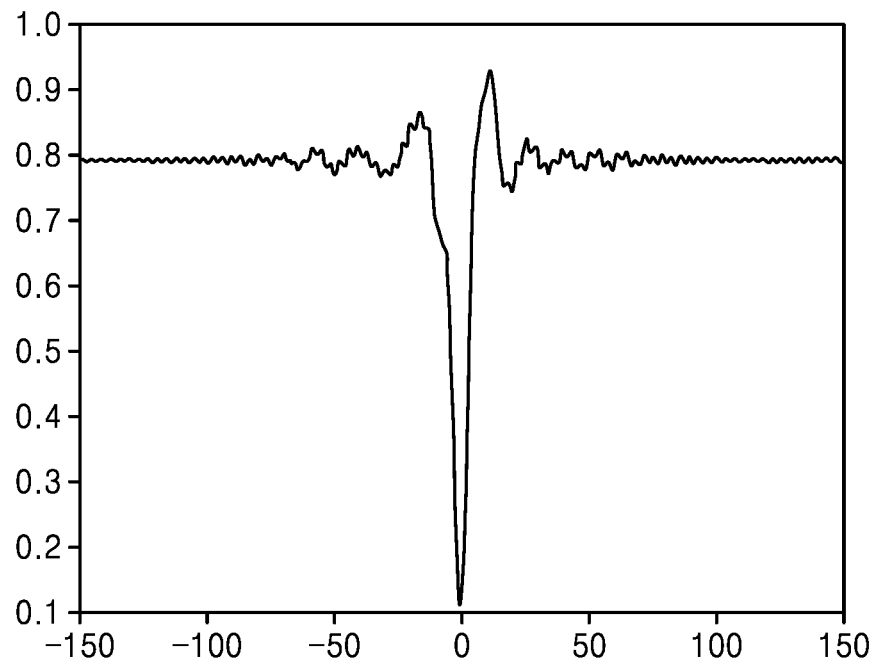
Figure 7C:
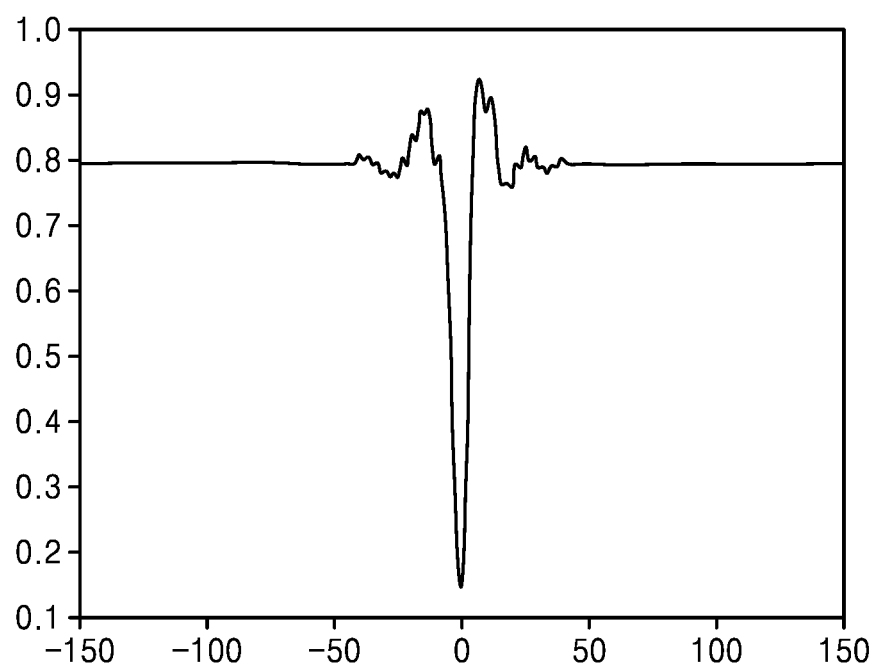
Figure 7D:
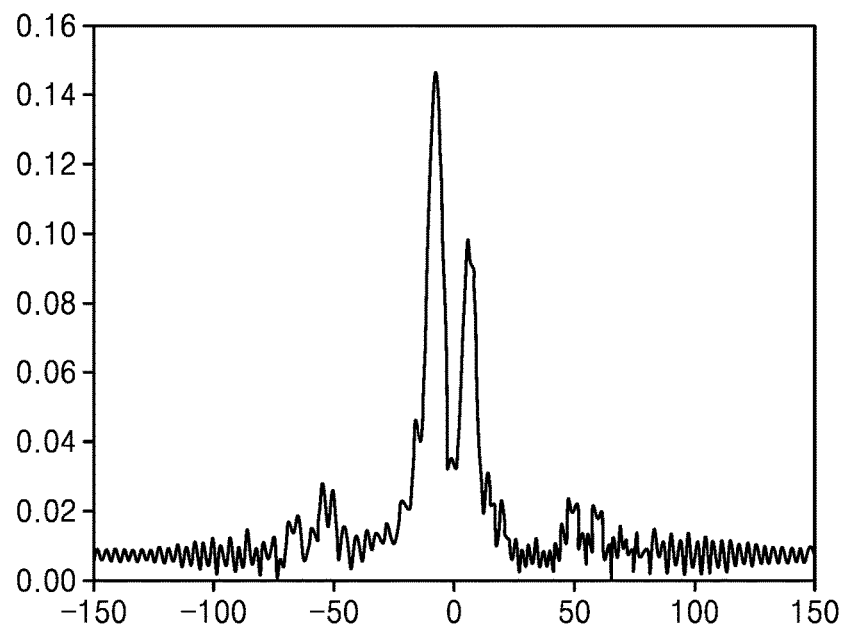

FIGS. 7A to 7D are conceptual diagrams for explaining a principle of generating the coupling filter and a principle of correcting the first mask image by using the coupling filter, in relation to the operation of correcting the first mask image in FIG. 1 (S140). In the graphs of FIGS. 7B and 7D, the horizontal axis may be a position in the first direction (x-direction) corresponding to the layout of the pattern in FIG. 7A in nm units, and the vertical axis may represent the amplitude of the near field in arbitrary unit (a.u.) units.

Referring to FIG. 7A, the layout of the pattern on the mask is illustrated, and the layout of the pattern may have a one-dimensional line shape. The layout of the pattern may have the line pattern shape and have a width of about 5 nm in the first direction (x direction). Since the layout of the pattern has a width of about 5 nm, a distance between edges extracted therefrom may correspond to about 5 nm. Accordingly, when the criterion for extracting the edge pairs, as the certain distance between adjacent edges, is about 15 nm, the edges extracted from the line pattern may correspond to edges that may be extracted as the edge pairs. In addition, the coupling effect between the edges may be large. On the other hand, a cut line extending in the first direction (x direction) at the central portion of the layout of the pattern in the second direction (y direction) may denote a portion where the mask images of FIGS. 7B and 7C are calculated.

Referring to FIG. 7B, a mask image obtained by the rigorous simulation for the layout of the pattern of FIG. 7A, that is, the rigorous mask image RMI is illustrated. It may be understood from the graph in FIG. 7B that, in the layout of the line pattern of FIG. 7A, the magnitude of the amplitude of the near field at the portion corresponding to the line pattern is small. In addition, it may be understood that the magnitude of the amplitude of the near field becomes almost constant as the distance from the layout of the line pattern increases toward the perimeter.

Referring to FIG. 7C, a mask image obtained by using the edge filter for the layout of the pattern of FIG. 7A, that is, the first mask image is illustrated. The first mask image may correspond to a mask image obtained by extracting both edges in the layout of the line pattern in FIG. 7A and then applying edge filters to the both edges. In addition, the first mask image may include the thin mask image TMI obtained by using the thin mask approximation.

In the first mask image obtained by using the edge filter, it may be understood that the magnitude of the amplitude of the near field at the portion corresponding to the line pattern is small, and in addition, the magnitude of the amplitude of the near field becomes almost constant as the distance from the line pattern toward the perimeter portion increases. However, as described above, when the width of the pattern is small, the coupling effect between the extracted edges may be large, and accordingly, the first mask image obtained by using the edge filter may have a difference from the rigorous mask image. The difference between the rigorous mask image and the first mask image may correspond to an error of the first mask image.

Referring to FIG. 7D, the subtracted mask image is illustrated that is obtained by subtracting the first mask image in FIG. 7C from the rigorous mask image illustrated in FIG. 7B. It may be understood that a change in the magnitude of the amplitude of the subtracted mask image in the portion corresponding to the line pattern is large and a change in the magnitude of the amplitude of the subtracted mask image is small as the distance from the line pattern increases. For reference, in FIG. 7D, the subtracted mask image illustrates a more enlarged scale of the amplitude compared to the rigorous mask image RMI in FIG. 7B and the first mask image in FIG. 7C.

In the method for performing OPC according to embodiments of the inventive concept, the subtracted mask image may correspond to the coupling filter in which the first mask image in FIG. 7C is subtracted from the rigorous mask image in FIG. 7B. By applying such a coupling filter to the edge pair portion having the large coupling effect, the error of the first mask image obtained by using the edge filter may be corrected. The definition of the coupling filter and the correction effect thereby is briefly described as the following.

First, as described above, the first mask image MI1 may be obtained by adding the thin mask image TMI obtained by the thin mask approximation to the mask image EFI obtained by the edge filter. Accordingly, the first mask image MI1 may be expressed by Formula 1.

$$MI1 = EFI + TMI \qquad \text{Formula 1.}$$

Here, the first mask image MI1 may include a mask image obtained by applying the edge filter to all edges. For example, in the case of the line pattern, by obtaining a mask image by applying the edge filter to both the left and right edges and then adding the mask image TMI obtained by the thin mask approximation to the obtained mask image, the first mask image MI1 may be obtained.

Next, based on the foregoing description, the mask image CFI obtained by the coupling filter may be expressed by Formula 2 with respect to the rigorous mask image RTI obtained by the rigorous simulation.

$$CFI = RTI - EFI - TMI \qquad \text{Formula 2.}$$

The corrected first mask image CMI1 may be obtained by adding the mask image CFI obtained by the coupling filter to the first mask image MI1. The corrected first mask image CMI1 may be expressed by Formula 3.

$$CMI1 = MI1(=EFI+TMI) + CFI(=RTI-EFI-TMI) = RTI \qquad \text{Formula 3.}$$

As a result, the corrected first mask image CMI1 may be substantially the same as the rigorous mask image obtained by the rigorous simulation for the pattern. Therefore, it may be expected that the corrected first mask image CMI1 may accurately represent the mask including the pattern to a certain degree. On the other hand, as described in the generation process of the coupling filter, only one coupling filter may be required to be applied to the edge pair, and it may not be required to apply the coupling filter to each edge. For example, in the case of the line pattern, only one coupling filter may be generated and applied.

In the method for performing OPC according to embodiments of the inventive concept, by correcting the first mask image MI1 obtained by the edge filter by using the coupling filter, a method of generating the mask image for a mask including a pattern may be good as the following. First, a method using a general edge filter may be used as it is. Accordingly, it may be possible to quickly calculate the mask image by using a general simulation for obtaining the mask image without a change of the simulation. Second, as described in the following description given with reference to FIGS. 9A through 9E, when coupling filters are calculated for patterns having several widths, the coupling filter may be generated quickly and easily by an interpolation on the patterns having various widths. Third, since the coupling effect between the adjacent patterns has been reflected in the edge filter and the coupling filter, other adjacent patterns may not need to be considered.

Figure 8:
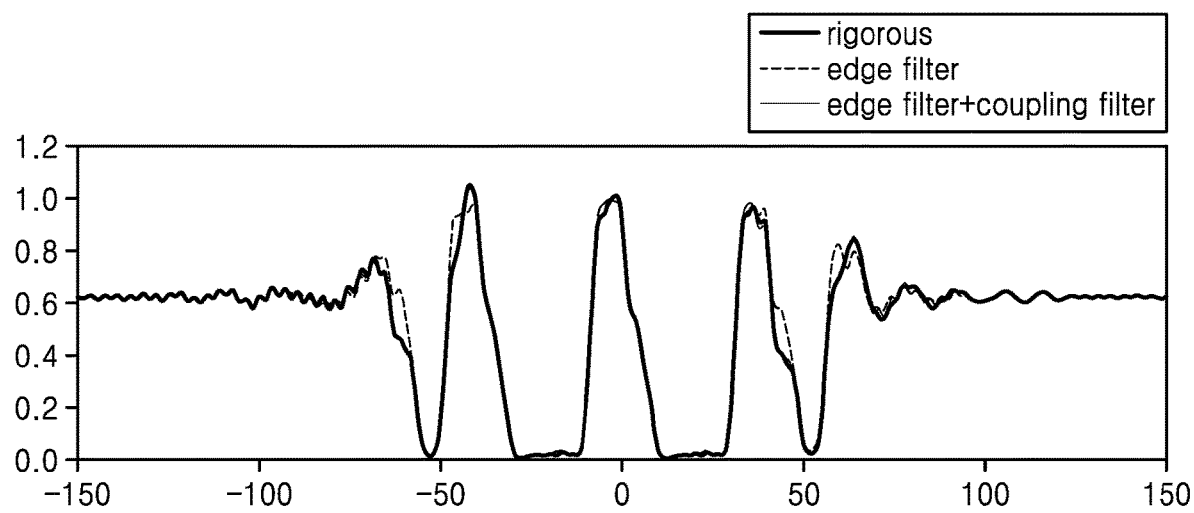
FIG. 8 is a graph illustrating a comparison between the rigorous mask image obtained by using the rigorous simulation, the first mask image obtained by using the edge filter, and the first mask image corrected by using the coupling filter, with respect to the layout of the mask pattern of FIG. 5A.

FIG. 8 is a graph illustrating a comparison between the rigorous mask image obtained by using the rigorous simulation, the first mask image obtained by using the edge filter, and the first mask image corrected by using the coupling filter, with respect to the layout of the mask pattern of FIG. 5A. The horizontal axis may be a position in the first direction (x-direction) corresponding to the layout of the pattern of FIG. 5A in nm units, and the vertical axis may represent the magnitude of the amplitude of the near field in arbitrary unit (a.u.) units. A thick solid line may represent the rigorous mask image, a dashed line may represent the first mask image, and a thin solid line may represent the corrected first mask image.

Referring to FIG. 8, the rigorous mask image obtained by using the rigorous simulation and the first mask image obtained by using only the edge filter may have differences at portions corresponding to the line pattern having a narrow width. The reason why may be attributed to the coupling effect between the adjacent edges of the narrow line pattern, as illustrated in the graph of FIG. 5C. On the other hand, it may be verified that the corrected first mask image obtained by additionally applying the coupling filter (the edge filter+ the coupling filter) has a shape substantially similar to the rigorous mask image. Thus, in the method for performing OPC according to embodiments of the inventive concept, the mask image for the mask including the corresponding pattern may be more accurately calculated by additionally correcting the first mask image obtained by using the edge filter by applying the coupling filter.

On the other hand, it may be very inefficient in terms of time to store the corresponding coupling filter in advance, with respect to the widths of all the patterns or all the space intervals in which the coupling effect occurs. Thus, a method of generating the coupling filter relatively easily and quickly with respect to the width of an arbitrary pattern or the interval of an arbitrary space may be required. In the method for performing OPC according to embodiments of the inventive concept, the coupling filter may be generated for the width an arbitrary pattern or the interval of an arbitrary space by using a linear interpolation.

It is assumed that a coupling filter has been calculated for widths of patterns or space intervals of two or more. For example, when a coupling filter for a line pattern of a width a is defined as CF(a) and a coupling filter for a line pattern of a width b is defined as CF(b), a coupling filter CF(c) for a line pattern of an arbitrary width c may be calculated by Formula 4.

$$CF(c)=[(b-c) \times CF(a)+(c-a) \times CF(b)]/(b-a)$$  Formula 4.

Here, the width b may be greater than the width a, and the width c may be an arbitrary value between the width a and the width b.

For example, when coupling filters calculated for a line pattern of 4 nm width and a line pattern of 8 nm width are defined as CF(4) and CF(8), respectively, a coupling filter CF(6) for a line pattern of 6 nm width may be calculated as [CF(4)+CF(8)]/2 by using Formula 4.

Figure 9A:
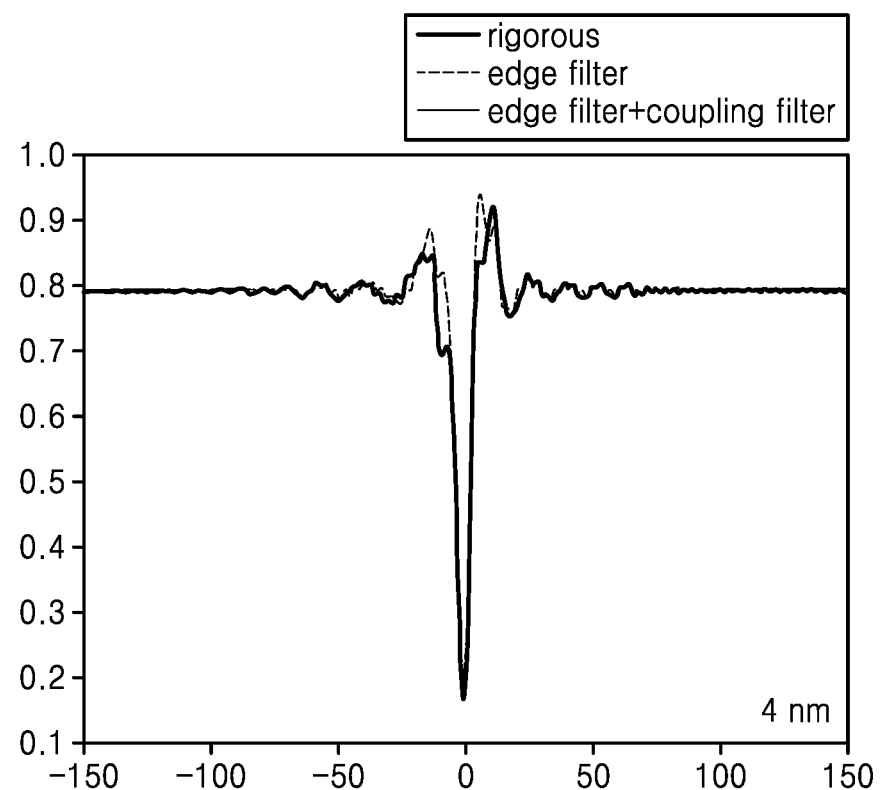
FIGS. 9A through 9E are graphs illustrating an accuracy of the coupling filters generated by the linear interpolation method.
Figure 9B:
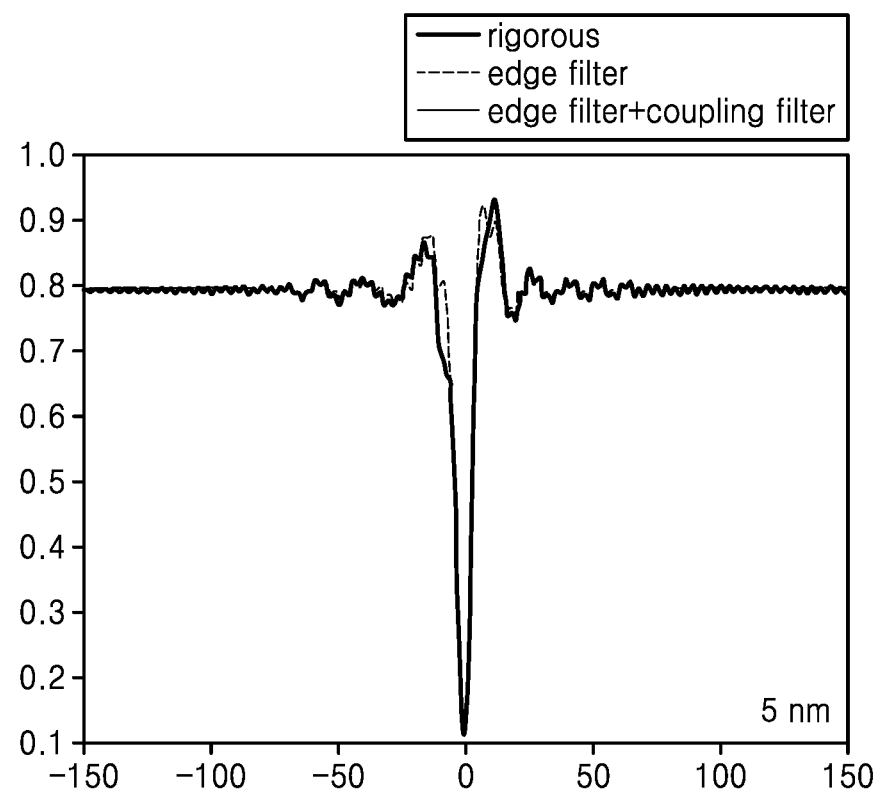
Figure 9C:
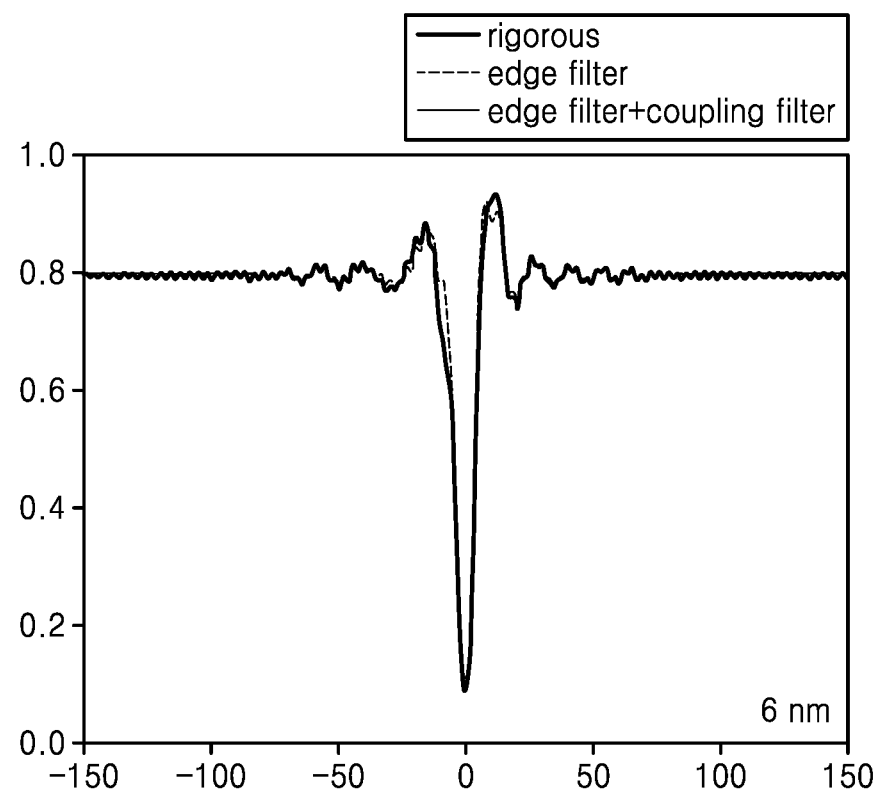
Figure 9D:
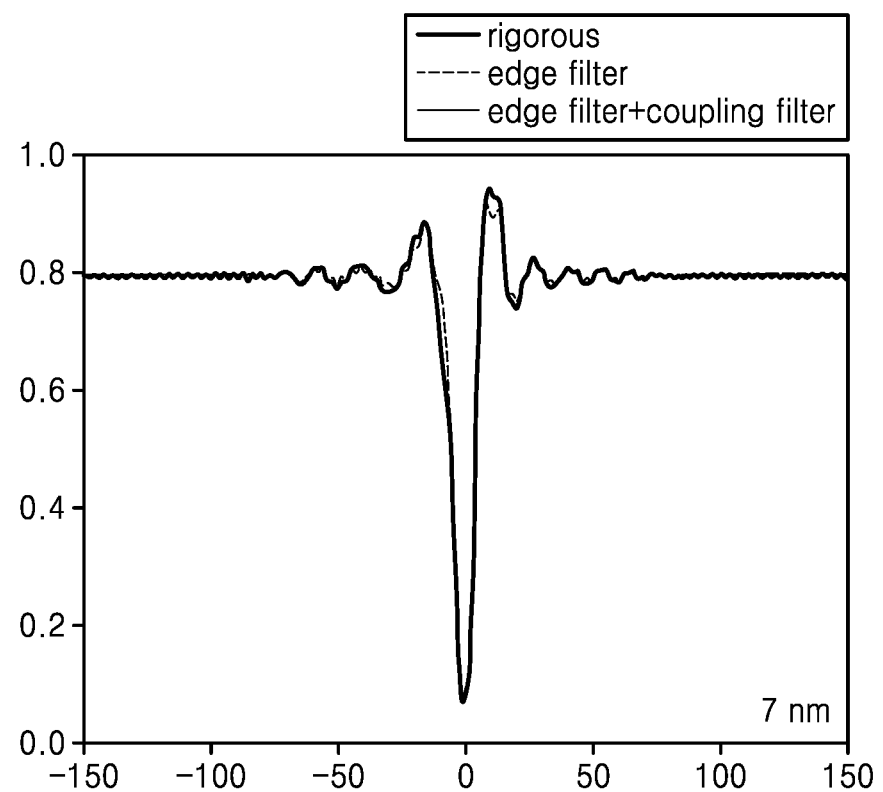
Figure 9E:
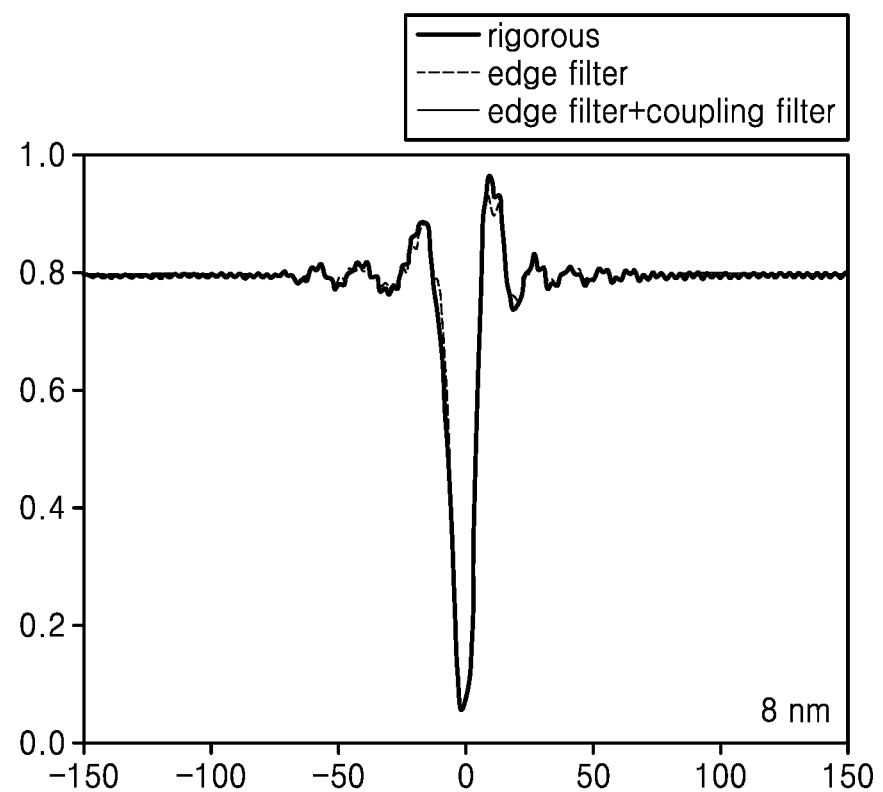

FIGS. 9A through 9E are graphs illustrating an accuracy of the coupling filters generated by the linear interpolation method. In FIGS. 9A and 9E, the horizontal axis may be a position in the first direction (x-direction) corresponding to the layout of the pattern in nm units, and the vertical axis may represent a magnitude of amplitude of a near field in arbitrary unit (a.u.) units. In addition, a thick solid line (rigorous) may represent the rigorous mask image, a dashed line (edge filter) may represent the first mask image, and a thin solid line (edge filter+coupling filter) may represent the corrected first mask image.

Referring to FIGS. 9A through 9E, the corrected first mask image (edge filter+coupling filter) for the line patterns of 4 nm and 8 nm widths may be the corrected first mask image by using the coupling filters for the line patterns of 4 nm and 8 nm widths. Here, the coupling filters for the line patterns of 4 nm and 8 nm widths may be generated through the process previously described with reference to FIGS. 7A through 7D. As illustrated, it may be understood that the corrected first mask image (edge filter+coupling filter) for the line patterns of 4 nm and 8 nm widths may be almost similar to the rigorous mask image (rigorous).

On the other hand, the corrected first mask image (edge filter+coupling filter) for line patterns of 5 nm, 6 nm, and 7 nm widths may be the corrected first mask image by using the coupling filters for the line patterns of 5 nm, 6 nm, and 7 nm widths. Here, the coupling filters for the line patterns of 5 nm, 6 nm, and 7 nm widths may be obtained by using Formula 4 based on the already calculated coupling filters for the line patterns of 4 nm and 8 nm widths. As illustrated, it may be understood that the corrected first mask image (edge filter+coupling filter) for the line patterns of 5 nm, 6 nm, and 7 nm widths may be almost similar to the rigorous mask image (rigorous). Thus, by using a coupling filter for widths of patterns or space intervals of at least two that have already been calculated, a coupling filter for a width of an arbitrary pattern or an interval of an arbitrary space may be calculated quickly with a high accuracy through a linear interpolation.

In the method for performing OPC according to embodiments of the inventive concept, even though the linear interpolation method is described as a method of calculating the coupling filter with respect to a width of an arbitrary pattern or an interval of an arbitrary space, the method of calculating the coupling filter with respect to a width of an arbitrary pattern or an interval of an arbitrary space is not limited to the linear interpolation method. For example, an extrapolation may be used to find a coupling filter for a width of a pattern that is greater than the width of the two calculated patterns. In addition, when the coupling effect for the width of the pattern is not linear, a polynomial interpolation or an exponential interpolation may be used instead of the linear interpolation.

Figure 10:
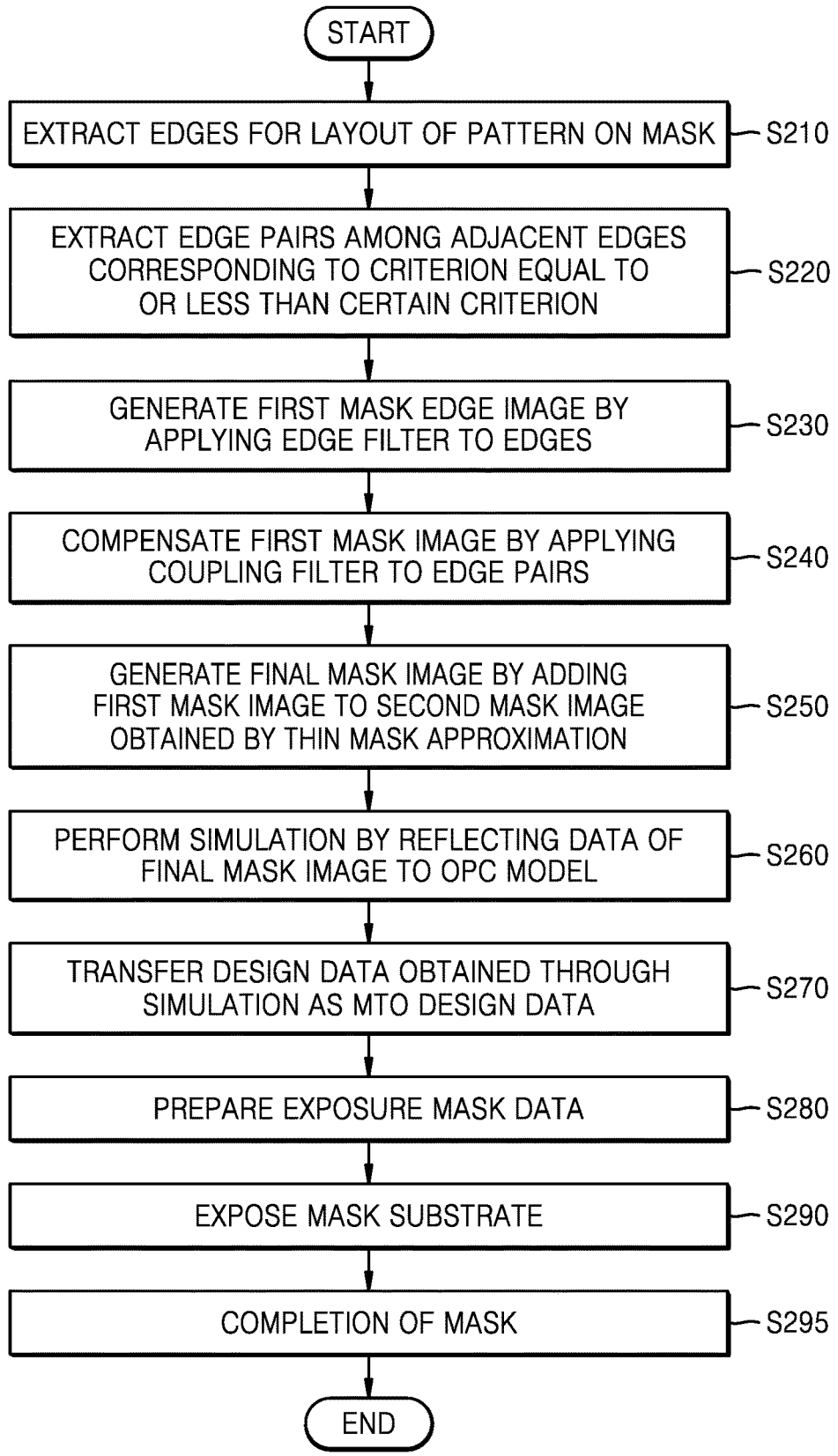
FIG. 10 is a flowchart of a process of a method of manufacturing a mask, according to an embodiment.

FIG. 10 is a flowchart of a process of a method of manufacturing a mask, according to exemplary embodiments of the inventive concept.

Referring to FIG. 10, the method of manufacturing the mask according to embodiments of the inventive concept may include performing OPC. The method for performing OPC may include, for example, from an operation of extracting edges (S210) to an operation of performing a simulation (S260). The operation of extracting the edges (S210) through the operation of generating the final mask image (S250) may be the same as the operations S110 through S150 of the method for performing OPC of FIG. 1. Thereafter, the simulation may be performed by reflecting data of the final mask image to the OPC model (S260). The operation of performing the simulation (S260) may include an operation of generating and verifying the OPC model. The operation of generating, verifying, and performing the OPC model may be the same as described in the description given with respect to FIG. 1. For reference, the final mask image generated in the operation of generating the final mask image (S250) may be used for generating the optical OPC model included in the OPC model.

After performing OPC and obtaining mask design data, MTO design data may be transferred (S270). In general, the MTO may denote a task of transferring the final mask data obtained through OPC to the mask production team as a request for manufacturing the mask. Thus, the MTO design data may eventually correspond to the final mask data obtained through OPC. The MTO design data may have a graphic data format that is used in electronic design automation (EDA) software, etc. For example, the MTO design data may have a data format such as graphic data system II (GDS2) and open artwork system interchange standard (OASIS).

After the MTO design data is transferred, an operation of mask data preparation (MDP) may be performed (S280). The MDP may include, for example, a format conversion known as fracturing, an augmentation of a bar code for mechanical reading, a standard mask pattern for inspection, a job deck, etc., and automatic and manual verification. Here, the job deck may denote an operation of creating a text file relating to a series of commands such as arrangement information about multi-mask files, reference dose, and exposure speed and method.

On the other hand, the format conversion, that is, the fracturing, may denote a process of dividing the MTO design data into respective regions and changing the MTO design data into a format for an electron beam exposure system. The fracturing may include, for example, data manipulation such as scaling, sizing of data, rotation of data, pattern reflection, and color reversal. In a conversion process through the fracturing, data of a number of systematic errors that may occur somewhere in a process of transferring the design data to an image on a wafer may be corrected. The data compensation process for the systematic errors may be referred to as mask process correction (MPC) and may include, for example, a line width adjustment called as a CD adjustment and an operation of increasing pattern arrangement accuracy. Thus, the fracturing may be a process which may contribute to quality improvement of the final mask and in addition, be performed proactively for an operation of mask process compensation. Here, the systematic errors may be caused by distortions that may occur in the exposure process, a mask development process, an etching process, a wafer imaging process, etc.

On the other hand, the MDP may include the MPC. The MPC may be referred to, as described above, as a process for correcting an error occurring during the exposure process, that is, a systematic error. Here, the exposure process may be a concept generally including writing, developing, etching, baking, etc. In addition, data processing may be performed ahead of the exposure process. The data processing may be a kind of a preprocessing process for a mask data and may include a grammar checking on the mask data, an exposure time prediction, etc.

After the mask data is prepared, a mask substrate may be exposed based on the mask data (S290). Here, the exposure may denote, for example, electron beam writing. The electron beam writing may be performed by a gray writing method using, for example, a multi-beam mask writer (MBMW). In addition, the electron beam writing may also be performed by using a Variable Shape Beam (VSB) exposure apparatus.

On the other hand, after the MDP is completed, a process of converting the mask data into pixel data may be performed ahead of the exposure process. The pixel data may be data that is directly used for an actual exposure and may include data of a shape of an object to be exposed and data of a dose assigned to each piece of the shape. Here, the data of the shape may be bit-map data in which the shape data, which is vector data, has been converted through rasterization, etc.

After the exposure process, a series of processes may be performed to complete the mask (S295). The series of processes may include processes such as development, etching, and cleaning. In addition, a series of operations for manufacturing a mask may include a measurement process, a defect inspection, and a defect repair process. In addition, a pellicle application process may be included. Here, the pellicle application process may denote a process of attaching pellicles to a surface of the mask to protect the mask against subsequent contamination during a delivery of the mask and a service life of the mask, when it is verified through the final cleaning and inspection that there are no contamination particles or chemical stains.

In the method of manufacturing a mask according to embodiments of the inventive concept, the mask may be an extreme ultraviolet (EUV) mask. However, the embodiment is not limited thereto, and a mask for another wavelength, such as a deep ultraviolet (DUV) mask, may also be manufactured.

A method of manufacturing a mask according to embodiments of the inventive concept may include a method for performing OPC for quickly and accurately calculating a mask image for a mask including a pattern through a method of correcting a first mask image obtained by an edge filter by using a coupling filter reflecting a coupling effect. Accordingly, the method of manufacturing the mask according to embodiments of the inventive concept may generate an accurate OPC model based on an accurate mask image, and generate optimal mask data by performing OPC based on the accurate OPC model. In addition, the method of manufacturing the mask according to embodiments of the inventive concept may provide a good mask capable of optimally forming a target pattern on a wafer by manufacturing a mask through an exposure process based on the optimal mask data.

A method for performing OPC according to technical aspects of the inventive concept may calculate quickly and accurately a mask image for a mask including a pattern through correcting a first mask image obtained by an edge filter by using a coupling filter reflecting a coupling effect. In addition, the method for performing OPC according to technical aspects of the inventive concept may, by calculating the mask image by using the edge filter and the coupling filter, calculate quickly and accurately the mask image without changing a simulation in a method of calculating an existing mask image.

A method of manufacturing a mask according to technical aspects of the inventive concept may generate an optimal mask data, through a correction method using the described-above coupling filter, by performing OPC by generating an accurate mask image and an accurate OPC model thereby. Thus, the method of manufacturing the mask according to technical aspects of the inventive concept may realize a good mask capable of optimally forming a target pattern on a wafer by manufacturing a mask through an exposure process based on the optimal mask data.

While the inventive concept has been particularly shown and described with reference to example embodiments thereof, it will be understood by one of ordinary skill in the art that various changes in shape and details may be made therein without departing from the spirit and scope of the inventive concept as defined by the following claims. Accordingly, the true scope of protection of the inventive concept should be determined by the technical idea of the following claims.

What is claimed is:

1. A method for performing optical proximity correction (OPC) comprising:
   extracting edges for a layout of a pattern on a mask;

extracting edge pairs for the layout of the pattern on the mask itself in which widths between adjacent edges among the edges are equal to or less than a certain distance;

generating a coupling edge for each of the edge pairs;

generating a first mask image by applying an edge filter to the edges; and correcting the first mask image by applying a coupling filter to the coupling edge, wherein edge filter corresponds to a first difference image obtained by subtracting a thin mask image obtained through a thin mask approximation from a rigorous mask image obtained through an electromagnetic field simulation in an edge portion of a pattern comprising the edge pairs, and wherein the coupling filter corresponds to a second difference image obtained by subtracting the first difference image and the thin mask image from the rigorous mask image for the mask pattern.

2. The method of claim 1, wherein the rigorous mask image corresponds to a near field image of the mask that is calculated on a rear surface of the mask immediately after light passes through the mask, and the first mask image corresponds to a portion of the near field image.

3. The method of claim 1, wherein the correcting of the first mask image comprises generating a final mask image by adding the corrected first mask image to a second mask image obtained by a thin mask approximation.

4. The method of claim 1, wherein the extracting of the edges for the layout comprises extracting vertical edges in a vertical direction and horizontal edges in a horizontal direction for the layout.

5. The method of claim 4, wherein the generating of the first mask image comprises applying different edge filters to the vertical edges on a left side and the vertical edges on a right side.

6. The method of claim 1, wherein the correcting of the first mask image comprises generating a final mask image by adding the corrected first mask image to a second mask image obtained by a thin mask approximation, and an optical OPC model is generated by using the final mask image.

7. A method for performing optical proximity correction (OPC) comprising:

extracting edges for a layout of a pattern on a mask;

extracting edge pairs among the edges for the layout of the pattern on the mask itself according to a criterion equal to or less than a certain criterion;

generating a coupling edge for each of the edge pairs;

generating a first mask image by applying an edge filter to the edges; and correcting the first mask image by applying a coupling filter to the coupling edge; and generating a final mask image by adding a second mask image obtained by a thin mask approximation to the first mask image, wherein the edge filter corresponds to a first difference image obtained by subtracting a thin mask image obtained through a thin mask approximation from a rigorous mask image obtained through an electromagnetic field simulation in an edge portion of a pattern comprising the edge pairs, and wherein the coupling filter corresponds to a second difference image obtained by subtracting the first difference image and the thin mask image from the rigorous mask image for the mask pattern.

8. The method of claim 7, wherein the criterion is determined by a distance between adjacent edges or a coupling effect between the adjacent edges.

* * * * *